United States Patent
Nowicki et al.

(10) Patent No.: US 10,502,786 B2
(45) Date of Patent: Dec. 10, 2019

(54) VEHICLE INCLUDING MULTIPLE ANALOG SWITCH MONITORING SYSTEM WITH SIMULTANEOUS SWITCH-STATE DETECTION

(71) Applicant: GM Global Technology Operations LLC, Detroit, MI (US)

(72) Inventors: Jeffrey R. Nowicki, Harrison Township, MI (US); Wade G. Johnson, Oxford, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 462 days.

(21) Appl. No.: 15/355,406

(22) Filed: Nov. 18, 2016

(65) Prior Publication Data

US 2018/0143250 A1      May 24, 2018

(51) Int. Cl.
*G01R 31/327*     (2006.01)
*B60L 3/00*       (2019.01)
(Continued)

(52) U.S. Cl.
CPC ........ *G01R 31/3277* (2013.01); *B60L 3/0084* (2013.01); *G08C 19/00* (2013.01); *G08C 19/04* (2013.01); *G01R 31/006* (2013.01)

(58) Field of Classification Search
CPC ....... G08C 19/00; G08C 19/04; B60L 3/0084; G01R 31/3277; G01R 31/006
(Continued)

(56) References Cited

U.S. PATENT DOCUMENTS 3,370,181 A * 2/1968 Sitomer .................. H03F 1/48
                                                327/491
4,118,700 A * 10/1978 Lenihan ............... G08B 25/018
                                                307/100
(Continued)

FOREIGN PATENT DOCUMENTS

WO    WO-2011152823 A1 * 12/2011 ........... B66B 5/0087

OTHER PUBLICATIONS

GradeStack. Duality—Introduction to Circuit Theory Concepts. https://gradestack.com/Circuit-Theory-and/Introduction-to-Circuit/Daulity/19345-3926-40326-study-wtw. Mar. 2016 (Year: 2016).*

*Primary Examiner* — Patrick Assouad
*Assistant Examiner* — Sean Curtis
(74) *Attorney, Agent, or Firm* — Cantor Colburn LLP

(57) ABSTRACT

An automotive vehicle includes a switch detection system with a hardware controller having a power supply configured to generate a supply voltage. A first switch assembly includes an input terminal configured to receive the supply voltage. The first switch assembly includes a first switch configured to operate in a first plurality of switch states. A second switch assembly is connected in series with the first switch assembly and includes an output terminal connected to a voltage reference point. The second switch assembly includes a second switch configured to operate in a second plurality of switch states. Based on a voltage potential across the input terminal and the output terminal, the hardware controller determines the first plurality of switch states independently from the second plurality of switch states, and determines the second plurality of switch states independently from the first plurality of switch states.

17 Claims, 4 Drawing Sheets

(51) Int. Cl.
 *G08C 19/04* (2006.01)
 *G08C 19/00* (2006.01)
 *G01R 31/00* (2006.01)

(58) Field of Classification Search
 USPC .......... 324/415; 307/99, 112–112, 116, 125, 307/130–131, 141.8; 340/426.27–426.36
 See application file for complete search history.

(56) References Cited

U.S. PATENT DOCUMENTS

| | | | | |
|---|---|---|---|---|
| 4,491,828 | A * | 1/1985 | Galvin | G08B 25/04 340/13.38 |
| 4,580,138 | A * | 4/1986 | Morrison | G08B 25/018 340/13.38 |
| 4,651,138 | A * | 3/1987 | Morrison | G08B 25/018 340/506 |
| 4,670,663 | A * | 6/1987 | Fancher | G01R 31/2844 307/113 |
| 4,823,021 | A * | 4/1989 | Shimada | G08C 19/30 307/112 |
| 4,884,070 | A * | 11/1989 | Hannaford | G08C 19/025 340/13.38 |
| 5,585,781 | A * | 12/1996 | Sumida | B60R 16/0315 340/455 |
| 6,193,019 | B1 * | 2/2001 | Sirigu | B66B 13/22 187/391 |
| 7,026,973 | B2 * | 4/2006 | Chu | H03M 11/24 341/154 |
| 7,109,892 | B2 * | 9/2006 | Owerfeldt | G05B 19/0425 340/13.38 |
| 7,408,274 | B2 * | 8/2008 | Sullivan | B60P 1/4478 307/130 |
| 7,511,651 | B1 | 3/2009 | Johnson | |
| 7,980,363 | B2 * | 7/2011 | Kattainen | B66B 5/0056 187/247 |
| 7,999,668 | B2 * | 8/2011 | Cawthorne | B60R 16/02 340/532 |
| 8,264,231 | B2 * | 9/2012 | Nakada | H03M 11/24 324/415 |
| 8,624,601 | B2 * | 1/2014 | Kimes | G01R 31/3275 324/415 |
| 9,128,155 | B2 * | 9/2015 | Xing | B66B 5/0087 |
| 9,329,237 | B2 * | 5/2016 | Edwards | H03K 17/18 |
| 9,543,084 | B2 * | 1/2017 | Yamamoto | H01H 9/167 |
| 9,554,080 | B2 * | 1/2017 | Plante | B60R 16/03 |
| 9,789,764 | B2 * | 10/2017 | Bissontz | B60L 3/04 |
| 9,835,687 | B2 * | 12/2017 | Edwards | H01H 71/04 |
| 9,878,733 | B2 * | 1/2018 | Enomoto | B62D 1/12 |
| 9,897,633 | B2 * | 2/2018 | Edwards | G01R 19/16576 |
| 10,053,032 | B2 * | 8/2018 | Plante | B60R 16/03 |
| 10,215,790 | B2 * | 2/2019 | Tornare | G01R 31/025 |
| 2003/0210055 | A1 * | 11/2003 | Porter | G05B 9/02 324/415 |
| 2007/0035903 | A1 * | 2/2007 | Sullivan | B60P 1/4478 361/78 |
| 2008/0122288 | A1 * | 5/2008 | Plante | B60R 16/03 307/10.1 |
| 2009/0212975 | A1 * | 8/2009 | Ausman | G01R 31/3277 340/945 |
| 2011/0187376 | A1 * | 8/2011 | Barrenscheen | G01R 31/327 324/416 |
| 2012/0081124 | A1 * | 4/2012 | Kimes | G01R 31/3275 324/415 |
| 2013/0106422 | A1 * | 5/2013 | Xing | B66B 5/0087 324/415 |
| 2013/0241563 | A1 * | 9/2013 | Heise | B60T 7/042 324/415 |
| 2014/0097850 | A1 * | 4/2014 | LAw | H01H 1/0015 324/415 |
| 2014/0152828 | A1 * | 6/2014 | Plante | B60R 16/03 348/148 |
| 2014/0300208 | A1 * | 10/2014 | Yamamoto | H01H 9/167 307/113 |
| 2015/0198666 | A1 * | 7/2015 | Edwards | H03K 17/18 324/415 |
| 2015/0217640 | A1 * | 8/2015 | Bissontz | B60L 58/20 307/9.1 |
| 2016/0236704 | A1 * | 8/2016 | Enomoto | B62D 1/12 |
| 2016/0313402 | A1 * | 10/2016 | Mauder | G01R 31/3277 |
| 2017/0040991 | A1 * | 2/2017 | D'Oyly-Watkins | H03K 17/18 |
| 2017/0080882 | A1 * | 3/2017 | Plante | B60R 16/03 |
| 2017/0322250 | A1 * | 11/2017 | Tornare | G01R 31/025 |
| 2018/0143250 | A1 * | 5/2018 | Nowicki | B60L 3/0084 |
| 2018/0281616 | A1 * | 10/2018 | Kim | B60L 11/1866 |
| 2018/0319356 | A1 * | 11/2018 | Plante | B60R 16/03 |
| 2019/0066938 | A1 * | 2/2019 | Ishida | H01H 1/605 |

* cited by examiner

VEHICLE INCLUDING MULTIPLE ANALOG SWITCH MONITORING SYSTEM WITH SIMULTANEOUS SWITCH-STATE DETECTION

FIELD OF THE INVENTION

The subject invention relates generally to vehicle electrical systems, and more specifically, to electrical switch networks of an automotive vehicle.

BACKGROUND

Conventional resistor ladder networks (see FIG. 1) are used in automotive vehicle electrical systems due to their ability to provide flexible implementation at low costs. These resistor ladder networks 100 are typically constructed as a voltage divider circuit 102 including a plurality of resistors 104a-104e with different resistive values, and a plurality of switches 106a-106d. Closing any one of the switches 106a-106d alters either the high resistance or the low resistance of the voltage divider circuit 102. The voltage divider circuit 102 comprises a high resistance between a supply voltage 108 and a first terminal 110, and a low resistance between a second terminal 112 and a low voltage reference 114. In this way, the resistance of the network 100 can vary and will exhibit a unique resistance range depending upon the selected state of a particular switch 106a-106d. The range of different resistances, however, cannot be achieved by operating only a single individual switch. Therefore, these conventional resistor ladder networks 100 inherently establish a priority scheme such that an output voltage of the voltage divider 102 indicates whether the switches 106a-106d are closed (e.g., a user switch selection).

However, the priority scheme resulting from conventional resistor ladder networks prevents the vehicle electrical system from simultaneously detecting activated switches. That is, conventional resistor ladder networks are incapable of detecting a state of a first switch independently from the state of the remaining switches included in the resistor ladder network. Therefore, vehicle states are assigned specific priorities which are then assigned to a particular switch based on the switches installed location in the resistor ladder network.

SUMMARY

In one non-limiting embodiment, an automotive vehicle includes a switch detection system with a hardware controller having a power supply configured to generate a supply voltage. A first switch assembly includes an input terminal configured to receive the supply voltage. The first switch assembly includes a first switch configured to operate in a first plurality of switch states. A second switch assembly is connected in series with the first switch assembly and includes an output terminal connected to a voltage reference point. The second switch assembly includes a second switch configured to operate in a second plurality of switch states. Based on a voltage potential across the input terminal and the output terminal, the hardware controller determines the first plurality of switch states independently from the second plurality of switch states, and determines the second plurality of switch states independently from the first plurality of switch states.

In another non-limiting embodiment, a switch detection system installed on an automotive vehicle includes a first switch assembly and a second switch assembly. The first switch assembly includes a first node configured to receive a supply voltage, and a first switch configured to operate in a first plurality of switch states. The second switch assembly is connected to a voltage reference point via a second node and connected in series with the first switch assembly via a third node. The second switch assembly includes a second switch configured to operate in a second plurality of switch states. The switch detection system further includes a hardware controller that is configured to determine an existing voltage potential across the first and second nodes among a plurality of different voltage potentials. Based on the existing voltage potential, the hardware controller determines the first plurality of switch states independently from the second plurality of switch states, and the second plurality of switch states independently from the first plurality of switch states.

In yet another exemplary embodiment, a method of simultaneously detecting switch states of a plurality of switches installed on an automotive vehicle includes generating a voltage potential across an input terminal and an output terminal of an input switching circuit. The input switching circuit comprises a first switch assembly and a second switch assembly. The first switch assembly that includes a first switch configured to operate in a first plurality of switch states, and the second switch assembly includes a second switch configured to operate in a second plurality of switch states. Based on the voltage potential, the method determines the first plurality of switch states independently from the second plurality of switch states, and determines the second plurality of switch states independently from the first plurality of switch states.

The above features and advantages and other features and advantages are readily apparent from the following detailed description when taken in connection with the accompanying drawings.

BRIEF DESCRIPTION OF THE DRAWINGS

Other features and details appear, by way of example only, in the following detailed description of embodiments, the detailed description referring to the drawings in which.

DESCRIPTION OF THE EMBODIMENTS

Figure 1:
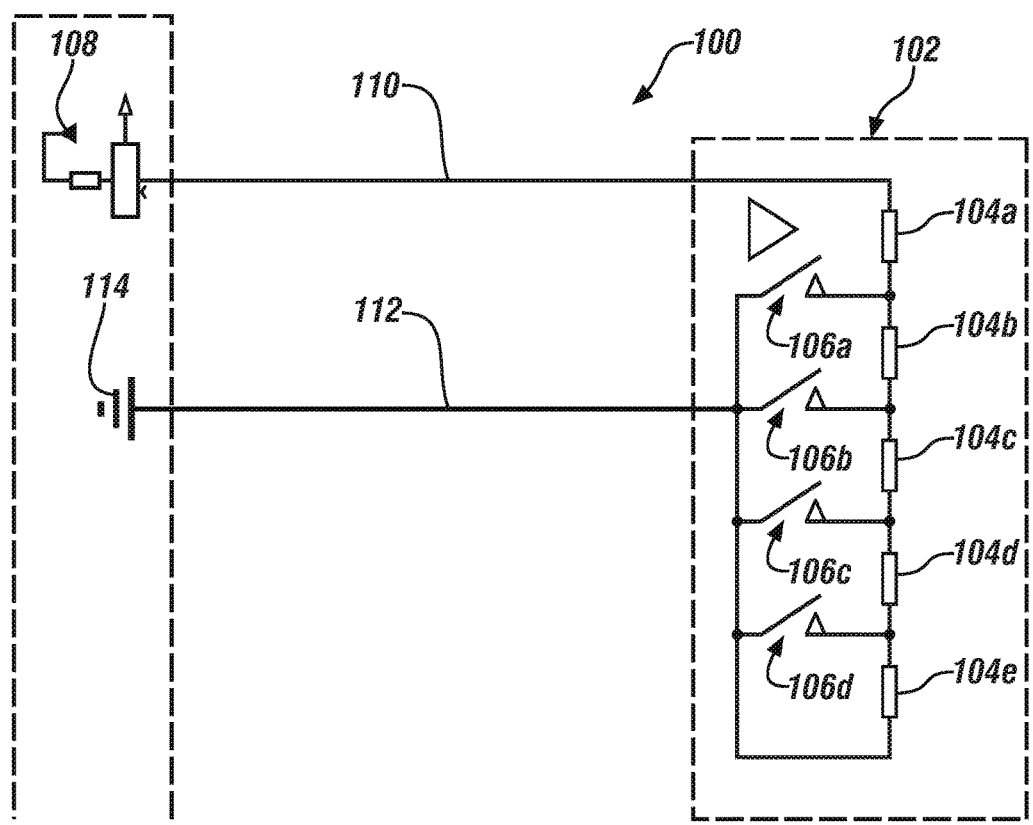
FIG. 1 is a block diagram of a resistor ladder network switch system.

The following description is merely exemplary in nature and is not intended to limit the present disclosure, its application or uses. It should be understood that throughout the drawings, corresponding reference numerals indicate like or corresponding parts and features.

In accordance with various non-limiting embodiments, a simultaneous switch detection system is provided which is configured to independently monitor the state of a plurality of switches. The simultaneous switch detection system includes an electronic switch detection controller connected to an input switching circuit which includes a plurality of analog switch assemblies. The switch assemblies are connected so as to generate a state table that indexes voltage ranges of the input switching circuit with respect to electrical states of the input switching circuit. The electrical states of the input switching circuit are cross-referenced to different operating states of a particular vehicle system, sub-system and/or component.

The activation of any one of the analog switches included in a switch assembly can "wake up" (i.e., initiate) the electronic switch detection controller. Once initiated, the electronic switch detection controller analyzes the existing electrical state of the input switching circuit, compares the existing electrical state to the state table stored in memory, and based on the comparison determines the state of the vehicle system, sub-system and/or component. Accordingly, each analog switch in the input switching circuit may be independently and simultaneously analyzed in response to a single input, thereby eliminating the need to prioritize the switches.

Figure 2:
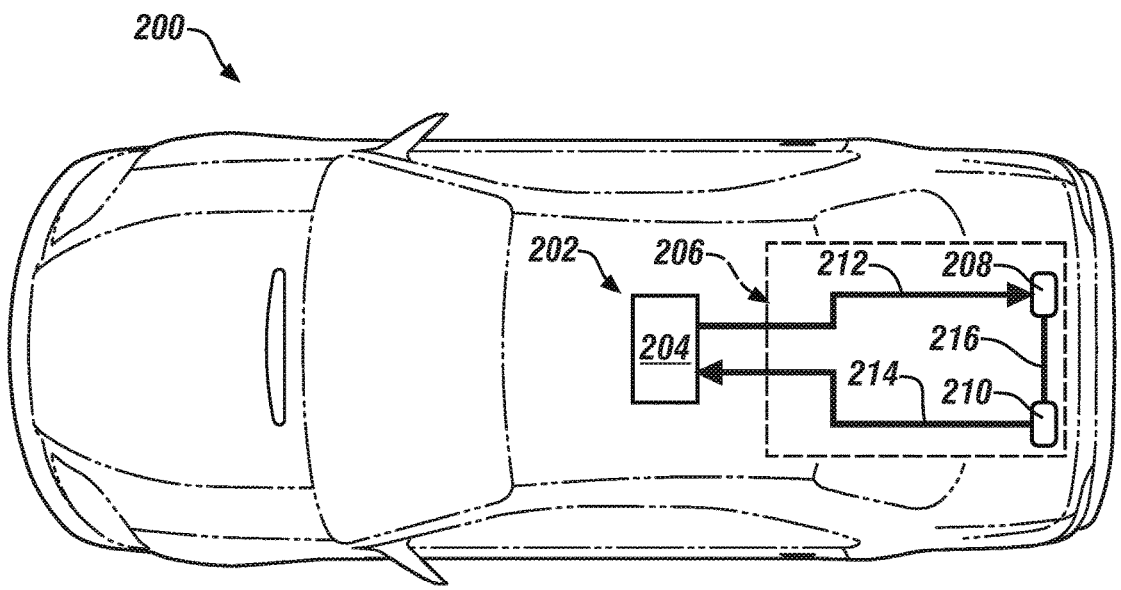
FIG. 2 illustrates a vehicle including a simultaneous switch detection system according to a non-limiting embodiment.

Turning now to FIG. 2, a vehicle 200 including a simultaneous switch detection system 202 is illustrated according to a non-limiting embodiment. The simultaneous switch detection system 202 includes an electronic switch detection controller 204 connected to an input switching circuit 206 which includes a plurality of analog switch assemblies 208 and 210. The switch detection controller 204 may be implemented as a stand-alone hardware controller or may be integrated within another controller installed on the vehicle 200. In at least one embodiment, the switch assemblies 208 and 210 include two independent analog switches that are located remotely from one another at different locations of the vehicle 200. The locations of switch assemblies 208 and 210 shown in FIG. 2 are not intended to be limiting, and although only two switch assemblies 208 and 210 are illustrated the number of switch assemblies included in the simultaneous switch detection system 202 is not limited thereto.

The switch assemblies 208 and 210 are connected so as to generate a state table indicating various electrical states of the input switching circuit 206. According to the non-limiting embodiment illustrated in FIG. 2, the first switch assembly 208 is connected to the switch detection controller 204 to define a first node 212, while the second switch assembly 210 is connected to the switch detection controller 204 to define a second node 214. The first node 212 may be viewed as a source signal circuit that is connected to an input terminal of the first switch assembly 208. The second node 214 may be viewed as a return circuit connected to the output terminal of the second switch assembly 210. The first and second switch assemblies 208 and 210 are connected in series with one another to define a third node 216 (i.e., common node 216). The electrical states of the individual switch assemblies 208 and 210 define the state table. The electrical states include, for example, the plurality of switch states of the first switch assembly 208, the plurality of switch states of the second switch assembly 210, and/or one or more circuit fault states of the input switching circuit 206. The state table can then be cross-referenced to different operating states of a particular vehicle system, sub-system and/or component as discussed in greater detail below.

Figure 3:
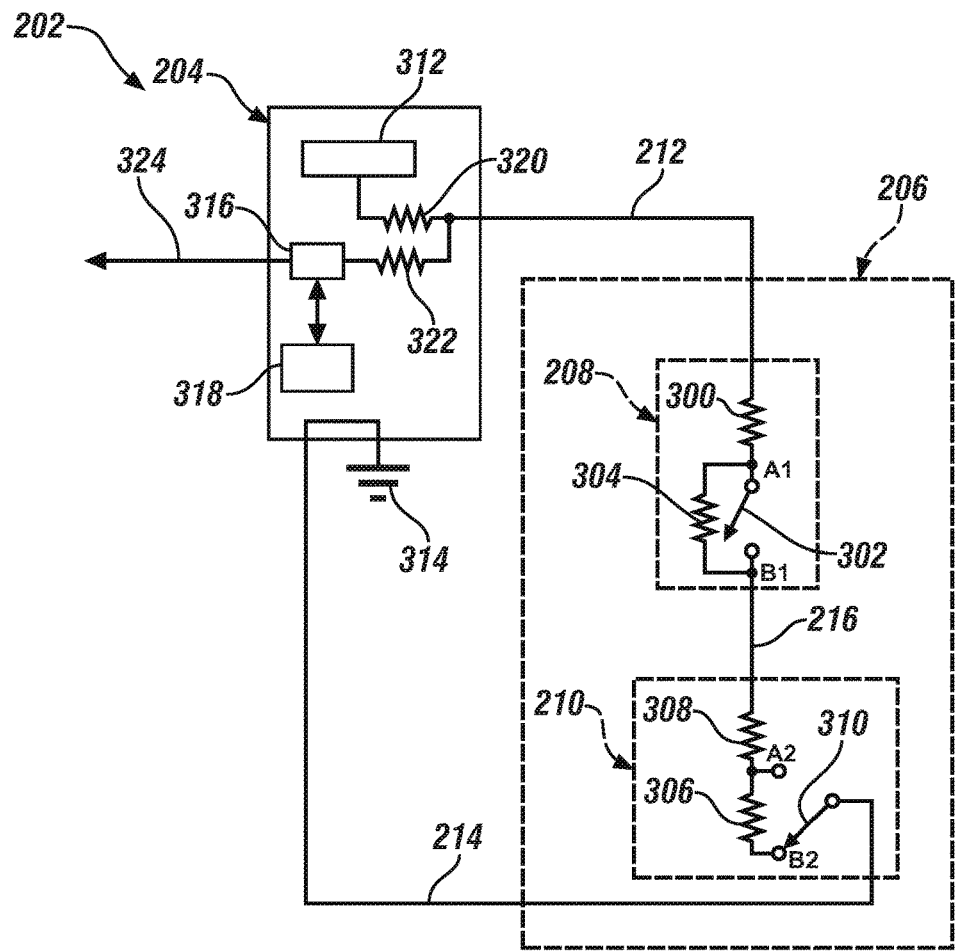
FIG. 3 is a block diagram of a simultaneous switch detection system according to a non-limiting embodiment.

Turning to FIG. 3, a simultaneous switch detection system 202 is illustrated in greater detail according to a non-limiting embodiment. The switch detection controller 204 is in signal communication with the input switching circuit 206 via the first node 212 and the second node 214. The input switching circuit 206 includes the first switching assembly 208 connected in series with the second switching assembly 210 via the common node 216.

The first switch assembly 208 includes at least one switch resistor that is selectively connected to the input switching circuit 206. For example, the first switching assembly 208 includes a first resistor (R1) 300, a first switch 302, and a second resistor (R2) 304. The first resistor (R1) 300 is connected in series with the first switch 302. The second resistor (R2) 304 is selectively connected in parallel with the first switch 302. That is, a first terminal of the second resistor 304 is connected to both the first resistor 300 and a first pole (A1) of the first switch 302 while the opposite terminal is connected to the common node 216 and a second pole (B1) of the first switch 302. In at least one example illustrated in FIG. 3, the first switch 302 is implemented as a single-pole, single-throw (SPST) switch such as, for example, a momentary switch. The first switch 302 may be open-biased to establish a first switch state, but invokes a second switch state when closed, i.e., when transitioned to contact the pole B1 which is connected to the common node 216. It should be appreciated, however, that the first switch 302 is not limited thereto, and other switch configurations can be employed without departing from the scope of the invention.

The second switch assembly 210 includes at least one second switch resistor that is selectively connected to the input switching circuit 206. For example, the second switch assembly 210 includes a third resistor (R3) 306, a fourth resistor (R4) 308, and a second switch (SW2) 310. A first terminal of the fourth resistor 308 is connected to the opposing terminal of the second resistor 304 and the second pole B1 of the first switch 302 to establish the common node 216. The opposing terminal of the fourth resistor 308 is connected to a first terminal of the third resistor 306 and a first pole (A2) of the second switch (SW2) 310.

The second switch 310 is implemented as a single-pole, double-throw (SPDT) switch. The first pole (A2) is connected between the opposing terminal of the fourth resistor 308 and the first terminal of the third resistor 306, while a second pole (B2) is connected to the opposing terminal of the third resistor 306. The second switch 310 may establish a first switch state when connected to the second pole B2, and a second switch state when connected to the first pole A2. When the first switch state of the second switch 310 is established, the third resistor 306 is connected to the input switching circuit 206. That is, current is capable of flowing through the third resistor 306 and then exits the input switching circuit 206 via the second switch 310. When, however, the second switch state is established, a current path between the fourth resistor 308 and the third resistor 306 is shorted to ground such that current exits the input switching circuit via the second switch 310 without flowing through the third resistor 306. In this manner, the third resistor 306 is disconnected from the input switching circuit 206.

The switch detection controller 204 is capable of detecting the change in resistance of the input switching circuit 206, thereby determining the existing switch state of the second switch 310 independent from the existing switch state of the first switch 302. Although the second switch 310 is described as a SPDT switch herein, it should be appreciated that the second switch 310 is not limited thereto and other switch configurations may be employed without departing from the scope of the invention.

The switch detection controller 204 includes a regulated power supply unit 312, a voltage reference point 314, a microprocessor 316, and a memory unit 318. The power supply unit 312 generates an input voltage (e.g., +5 volts) that is applied to the first node 212, while the reference point 314 (e.g., ground) is connected to the second node 214 so as to generate a voltage potential across the input switching circuit 206. The reference point 314 provided locally by the switch detection controller 204 eliminates a voltage potential error differential that can arise if the second node 214 is connected to another ground potential located remotely from the switch detection controller 204. The regulated power supply unit 312 may be shared between the microprocessor 316 and the switch detection controller 204, or may be constructed as separate voltage sources to power the microprocessor 316 and the switch detection controller 204, respectively.

In at least one embodiment, the switch detection controller 204 includes a pull-up resistor 320 and an electro-static discharge (ESD) resistor 322. The pull-up resistor 320 has a first terminal connected to the power supply unit 312 and a second terminal connected to the first node 212. The ESD resistor 322 has a first terminal connected to the microprocessor 316 and a second terminal that is commonly connected to the first node 212 and the second terminal of the pull-up resistor 320. In this manner the ESD resistor 322 is configured to provide noise filtering and to protect the switch detection controller 204 from ESD events. In at least one embodiment, the switch detection controller 204 is configured to operate in a low-power mode (i.e., sleep mode). The connection of the pull-up resistor 320 and the ESD resistor 322 also establishes a wake-up circuit that allows the switch detection controller 204 to "wake-up" (i.e., initialize) in response to activity from the first switch 302 and/or the second switch 310.

The memory unit 318 stores a state table, software logic, and other algorithms capable of identifying the independent electrical states of each switch assembly 208 and 210, and thus the overall electrical state of the input switching circuit 206. In at least one embodiment, the state table cross-references a plurality of voltages ranges with the plurality of first switch states of the first switch 302 the plurality of second switch states of the second switch 310. The electrical state of the input switching circuit 206 changes as the state of each independent switching assembly 208 and 210 changes. The existing electrical state of the input switching circuit 206 can be cross-referenced with the state table stored in the memory unit 318 to determine an existing operating state of a particular vehicle system, sub-system and/or component.

Unlike conventional resistor ladder networks, each analog switch 302 and 310 may be independently and simultaneously analyzed in response to a single input. For example, the switch detection controller 204 can compare an existing voltage potential to the plurality of voltage ranges listed in the state table. Based on the voltage range that encompasses the existing voltage potential, the switch detection controller 204 determines the first plurality of switch states of the first switch 302 independently from the second plurality of switch states of the second switch 310, and vice versa. Thus, the existing state of various different vehicle systems, sub-systems and/or components can be simultaneously monitored and detected.

For instance, the activation of any one of the analog switches 302 and 310 included in the first switch assembly 208 and the second switch assembly 210, respectively, "wakes up" (i.e., initiates) the switch detection controller 204. Once initiated, the switch detection controller 204 analyzes the switch states of the first and second switches 302 and 310, determines the existing overall electrical state of the input switching circuit 206, and compares the existing electrical state of the switching circuit 206 to the state table stored in the memory unit 318. Based on the comparison, the microprocessor 316 determines the existing state of the vehicle system, sub-system and/or component.

In at least one embodiment, the microprocessor 316 outputs one or more detection signals 324 indicating the existing state of each switch 302 and 310, and thus the existing state of the corresponding vehicle system, sub-system and/or component assigned to the independent switch 302 and 310. Accordingly, each analog switch 302 and 310 in the input switching circuit 206 may be independently and simultaneously analyzed in response to a single input, e.g., activation of either switch 302 and 310.

According to a non-limiting embodiment, the resistance values increase with respect to the first resistor (R1) 300, the second resistor (R2) 304 and the third resistor (R3) 306. For example, the first resistor (R1) 300 has a resistance of approximately 604 ohms (Ω), the second resistor (R2) 304 has a resistance of approximately 1500Ω, and the third resistor (R3) 306 has a resistance of approximately 2490Ω. The fourth resistor (R4) 308 may be set at 0Ω thereby acting as a "zero-ohm jumper" or wire link. In another embodiment, for example, the resistance values decrease with respect to the first resistor (R1) 300, the second resistor (R2) 304 and the third resistor (R3) 306. It should be appreciated that the resistance values described herein are provided as examples and may be set at different values based on the particular application of the simultaneous switch detection system 202. In at least one embodiment, the resistance value of the first resistor 300 is approximately 40% of the resistance provided by the pull-up resistor 320. Based on the resistance values of the input switching circuit 206, the switching states of the first switch (SW1) 302 and second switch (SW2) 310, and the operating parameters of the controller 204 such as Vin (e.g., +5V), a state table (TABLE 1) may be established as described below.

TABLE 1

| | |
|---|---|
| 0 V | Short-to-Ground (STG) - Out of Range Low |
| 1.0098 V (R1) Detected | SW1 Closed (Second Switch State) AND SW2 connected to Pole A2 (Second Switch State) |
| 1.3701 V | Deadband |
| 2.3326 V (R1 + R2) Detected | SW1 Open (First Switch State) & SW2 connected to Pole A2 OR STG Between Switches |
| 2.7189 V | Deadband |
| 2.7972 V (R1 + R3) Detected | SW1 Closed (Second Switch State) AND SW2 connected to Pole B2 (First Switch State) |
| 3.1868 V | Deadband |
| 3.2428 V (R1 + R2 + R3) Detected | SW1 Open (First Switch State) AND SW2 connected to Pole B2 (First Switch State) |
| 3.6363 V | Open Circuit - Out of Range Hi |
| Supply Voltage (5 V) | |

The selected resistances of the first resistor 300, second resistor 304, third resistor 306, and fourth resistor 308 define "Deadband" ranges which allow the switch detection controller 204 to distinguish between the different states of the first switch (SW1) 302 and the second switch (SW2) 310.

For example, when a voltage ranging from 0 V to 1.0098 V exists across the first node 212 and the second node 214, the switch detection controller 204 determines a short-to-ground (STG) fault exists. However, when the voltage across the first node 212 and the second node 214 ranges from 1.0099 V to 1.3700, the switch detection controller 204 detects the resistance applied by only the first resistor (R1) 300. Since the fourth resistor (R4) 308 is set as a 0-ohm jumper, the resistance of the fourth resistor (R4) 308 may be disregarded. Accordingly, the switch detection controller 204 determines that the first switch (SW1) 302 is closed (i.e., contacts pole B1) and the second switched (SW2) 310 is connected to pole A2.

When the voltage across the first node 212 and the second node 214 ranges from 2.3327 V to 2.7188 V, the switch detection controller 204 detects the resistance applied by both the first resistor (R1) 300 and the second resistor (R2) 304. As mentioned herein, the fourth resistor (R4) 308 is set as a 0-ohm jumper and therefore may be disregarded. Accordingly, the switch detection controller 204 determines that the first switch (SW1) 302 is open (i.e., does not contact pole B1) and the second switched (SW2) 310 is connected to pole A2.

When the voltage across the first node 212 and the second node 214 ranges from 2.7973 V to 3.1867 V, the switch detection controller 204 detects the resistance applied by the first resistor (R1) 300 and the third resistor (R3) 306, but not the second resistor (R2) 304. As mentioned herein, the fourth resistor 308 is set as a 0-ohm jumper is therefore not taken into account. It can easily be appreciated, however, that the switch detection controller 204 may take into account any resistance by the fourth resistor 308 and still accurately determine the states of the first switch (SW1) 302 and the second switch (SW2) 310, respectively. Accordingly, the switch detection controller 204 determines that the first switch (SW1) 302 is closed and the second switched 310 is connected to pole B2.

When the voltage across the first node 212 and the second node 214 ranges from 3.2429 V to 3.6362 V, the switch detection controller 204 detects the resistance applied by the first resistor (R1) 300, the second resistor (R2) 304, and the third resistor (R3) 306. As mentioned herein, the fourth resistor 308 is set as a 0-ohm jumper may therefore be disregarded. Accordingly, the switch detection controller 204 determines that the first switch (SW1) 302 is open and the second switched (SW2) 310 is connected to pole B2. If, however, the voltage across the first node 212 and the second node 214 exceeds 3.6363 V, or matches the source voltage (e.g., 5 V) generated by the power supply unit 312, then the switch detection controller 204 determines an open-circuit fault exists in the input switching circuit 206.

As described herein with reference to Table 1, for example, the switch detection system 202 includes a single controller 204 configured to simultaneously determine the switch state of the first switch 302 independently from the switch state of the second switch 310, and vice versa, based on the voltage potential across the first node 212 and the second node 214. That is, any of the switch states provided by the first switch 302 can be detected simultaneously along with any of the switch states provided by the second switch 310 thereby overcoming the priority scheme limitation that is inherent to conventional resistor ladder networks. In at least one embodiment, the switch detection controller 204 determines (1) activation of a first switch 302 independent of the state of a second switch 310, (2) activation of a second switch 310 independent of the state of the first switch 302, (3) simultaneous activation of the first switch 302 and the second switch 310, (4) disconnection/connection of the first switch 302 and/or the second switch 310, (5) a short circuit fault of the input switch circuit 206, and (6) an open circuit fault of the input switch circuit 206.

Figure 4A:
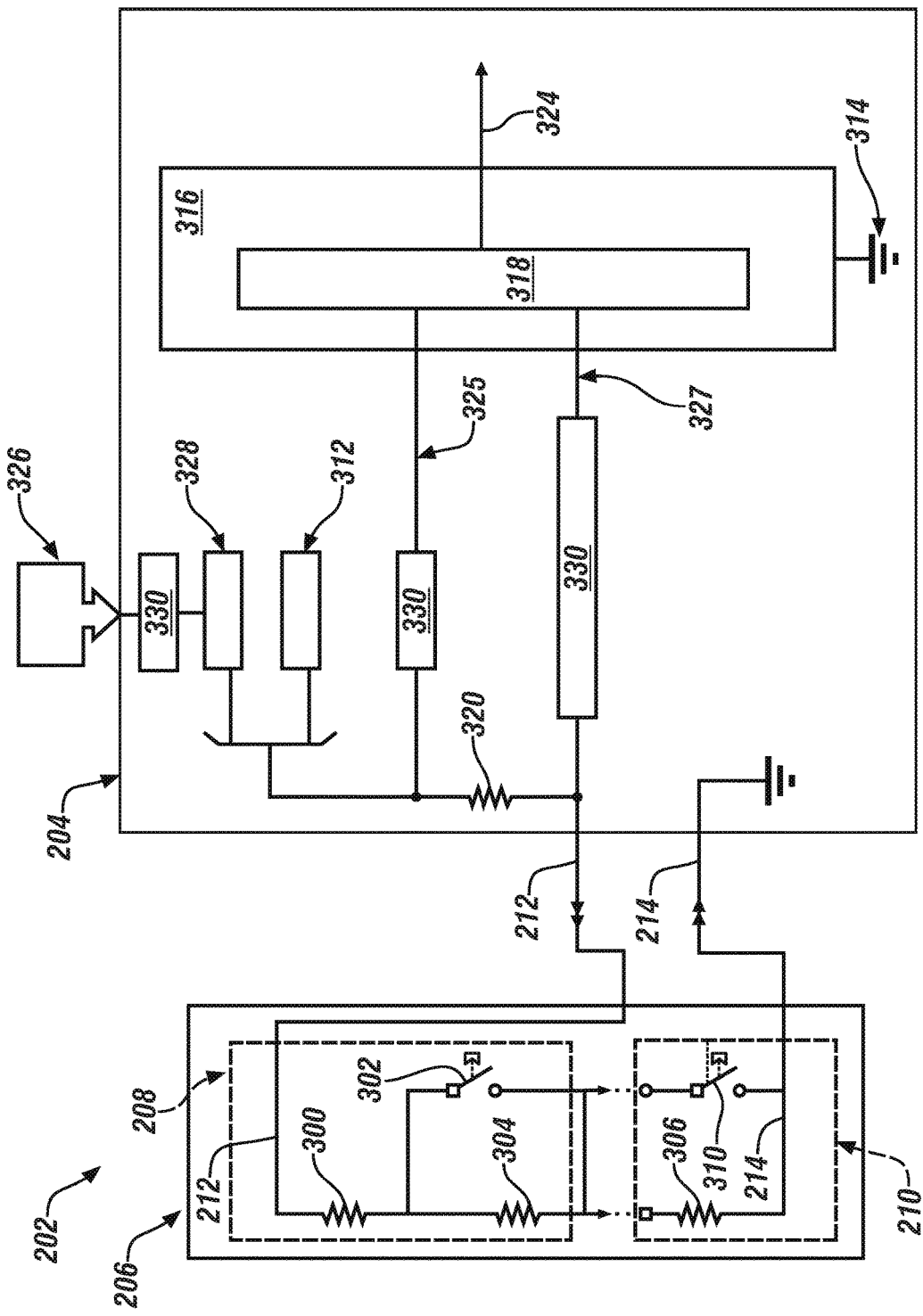
FIG. 4A is a schematic diagram of a low-side simultaneous switch detection system according to a non-limiting embodiment.

Turning now to FIG. 4A, a low-side switch detection system 202 including an input switching circuit 206 in signal communication with a switch detection controller 204 is illustrated in greater detail according to a non-limiting embodiment. As described herein, the input switching circuit 206 includes a first node 212 and a second node 214 that are each connected to the switch detection controller 204. The first node 212 is configured to receive an input voltage supplied by the switch detection controller 204 while the second node 214 is connected to a voltage reference point 314 (e.g., ground) locally provided by the switch detection controller 204. The input switching circuit 206 further includes a first switch assembly 208 and a second switch assembly 210 connected in series with each other. The first switch assembly 208 and the second switch assembly 210 operate according to the aforementioned descriptions herein.

The switch detection controller 204 includes a power supply unit 312, a microprocessor 316. The switch detection controller 204 can also include an ESD and noise filtering circuit. The power supply unit 312 includes a voltage source 326 that delivers an input voltage to the first node 212. An input of the microprocessor 316 is connected to the first node 212 (i.e., the input supply circuit 212) via a suppression and signal conditioning component 330 included in the ESD and noise filtering circuit 323. The suppression and signal conditioning component 330 is configured to perform various functions including, but not limited to, signal conditioning, filtering, and voltage scaling.

The microprocessor 316 includes a memory unit 318 configured to store a state table. The state table indicates the different electrical states of each switch assembly 208 and 210, and thus the overall electrical switch state of the input switching circuit 206. Although not illustrated, the microprocessor 316 may also include an analog-to-digital converter. In this manner, the analog voltages detected by the switch detection controller 204 may be converted into digital data and output via signal 324 to indicate the existing state of the first switch 302 and the second switch 310.

In the embodiment illustrated in FIG. 4A, the switch detection controller 204 may also include a wake-up circuit that includes a wake-up switch 328 and a pull-up resistor 320. The wake-up switch circuit assists in removing power from the pull-up resistor 320 and the input switching circuit 206. The wake-up switch 328 may be constructed as a semiconductor switch such as a field effect transistor (FET), for example, having a source terminal connected to the voltage source 326, and a drain terminal connected to a first terminal of the pull-up resistor 320. The opposing second terminal of the pull-up resistor 320 is connected to the first node 212. When no voltage is applied to the gate terminal of the wake-up switch 328, the current path between the voltage source 326 and the first node 212 is kept open. Accordingly, power is cut-off from the switch detection system 202 thereby preserving overall battery power of the vehicle 200. When, however, a voltage is applied to the gate terminal of the wake-up switch 328, the current path between the voltage source 326 and the first node 212 is established and the switch detection system 202 is activated. Although the wake-up switch 328 is illustrated as being a separate component located externally from the voltage source 326, it should be appreciated that the wake-up switch 328 may be integrated within the voltage source 326.

The opposing second terminal of the pull-up resistor 320 is connected to the first node 212. Another suppression and signal conditioning circuit 330 connected between the second terminal of the pull-up resistor 320 and the microprocessor 316, and is configured to filter noise from the input of the microcontroller 316 while also protecting the microcontroller 316 from ESD events. The suppression and signal condition circuit 330 may also include an ESD resistor (e.g., element 322 in FIG. 3) that assists in providing electromagnetic compatibility (EMC) suppression. The EMC suppression includes, but is not limited to, electrostatic discharge (ESD), transients, injection/leakage currents, microprocessor protection, over-voltage conditions, under-voltage conditions, and reverse polarity.

A feedback circuit 325 is typically included when the voltage source 326 is an unregulated voltage source. The feedback circuit 325 is connected between the ESD circuit 323 and the microcontroller 316 and is configured to provide diagnostics corresponding to the voltage source (e.g., is the source voltage sufficient before trusting the input value 327.) Circuit 325 will also provide software logic the actual voltage applied to the switch assemblies 208 and 208. Monitoring the actual voltage of an unregulated supply can be used in software logic (e.g., ratio-metric calculations) to make a determination/decision using both the source voltage and input voltage. The feedback circuit 325 may be an optional feature when the voltage source 326 is a regulated voltage source.

Figure 4B:
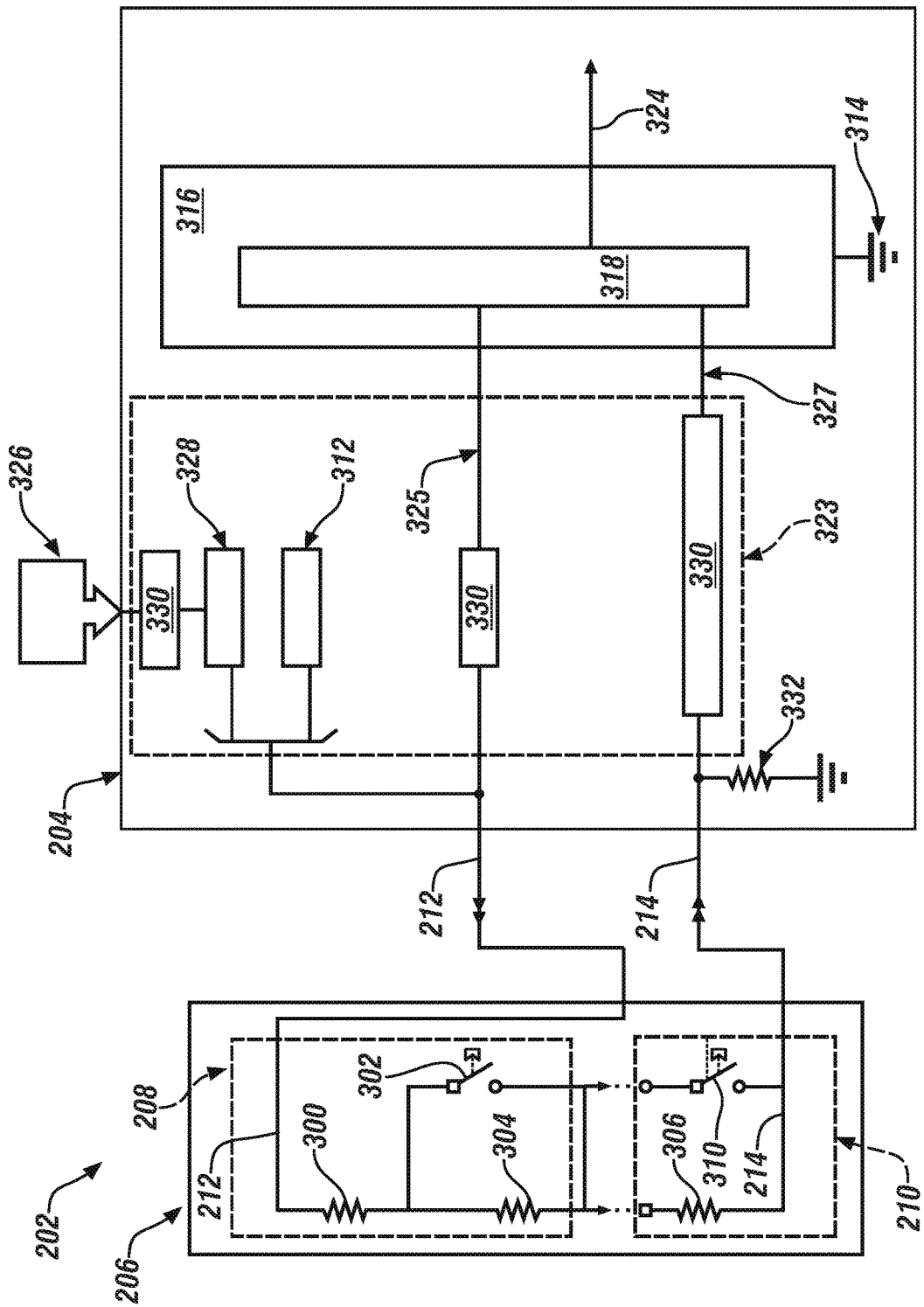
FIG. 4B is a schematic diagram of a high-side simultaneous switch detection system according to a non-limiting embodiment.

With reference to FIG. 4B, a high-side switch detection system 202 including an input switching circuit 206 in signal communication with a switch detection controller 204 is illustrated in greater detail according to a non-limiting embodiment. The simultaneous switch detection system 202 shown in FIG. 4B operates in a similar manner to the simultaneous switch detection system 202 shown in FIG. 4A. In this embodiment, the input of the microcontroller 316 is connected to the second node 214 (i.e., the return circuit 214). Accordingly, the pull-up resistor (indicated as resistor 320 in FIG. 4A) is omitted such that the first node 212 (i.e., the input supply circuit 112) can be connected directly to the ESD circuit 323.

Figure 5:
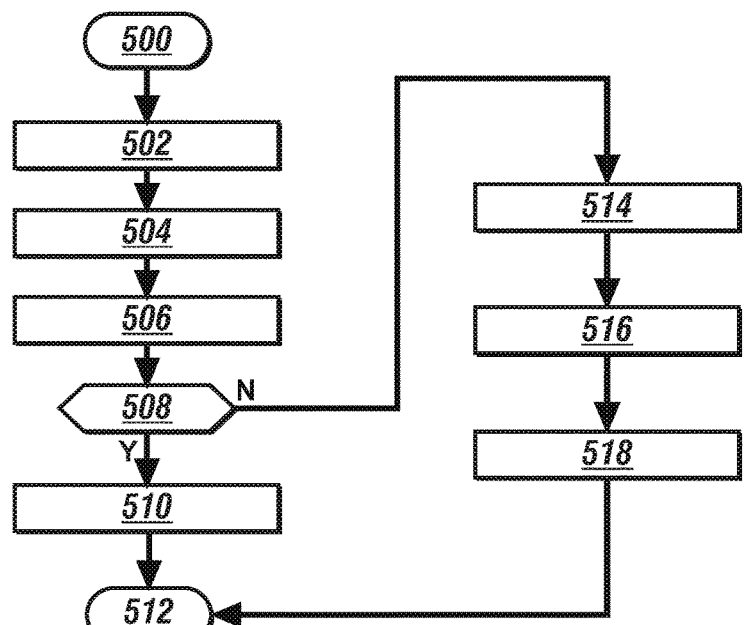
FIG. 5 is a flow diagram illustrating a method of simultaneously detecting switch states of a plurality of switches installed on an automotive vehicle according to a non-limiting embodiment.

Turning now to FIG. 5, a flow diagram illustrates a method of simultaneously detecting switch states of a plurality of switches installed on an automotive vehicle according to a non-limiting embodiment. The method begins at operation 500, and at operation 502 a wake-up signal is detected. In response to detecting a wake-signal, an input voltage is supplied to an input switching circuit 206 of the switch detection system 202. At operation 504, the existing voltage potential across the input switching circuit 206 is measured. The measurement may be performed by a switch detection controller 204 installed on the vehicle 200. At operation 506, the existing voltage potential is compared to a state table stored in memory 318 of the switch detection controller 204.

The state table lists a corresponding output action for each specific input value. In at least one embodiment, the state table cross-references a plurality of voltage ranges to a plurality of first switch states of the first switch 302 and a plurality of second switch states of the second switch 310. The state table can also cross-reference the plurality of voltage ranges to one or more circuit fault states of the input switching circuit 206 along with the first and second switch states. The switch detection controller 204 compares the existing voltage potential to the plurality of voltage ranges listed in the state table, and based on the voltage range that encompasses the existing voltage potential simultaneously determines the existing switch state of the first switch 302 independently from the existing switch state of the second switch 310. The comparison between the existing voltage potential and the voltage ranges in the state table 318 can also determine whether a circuit fault exists in the input switching circuit 206 as described herein.

Turning to operation 508, when an existing voltage potential falls within a voltage range corresponding to a circuit fault condition, an output signal is generated to alert of the detected circuit fault condition at operation 510. The circuit fault condition includes, but is not limited to, an over-voltage condition, a short-to-ground condition, and an open-circuit condition. The alert may include, for example, an audio alert, a graphical alert displayed on the vehicle dashboard, etc. After outputting the alert, the method ends at operation 512.

When, however, a circuit fault condition is not detected at operation 508, the existing switch state of the input switching circuit 206 is determined at operation 514. Unlike conventional resistor ladder networks, detecting the existing switch state of the input switching circuit 206 includes simultaneously determining an existing switch state of the first switch 302 independently from the existing switch state of the second switch 310. At operation 516, an operating state of a first vehicle component (e.g., is an emergency hood release switch open or closed) is determined based on the existing switch state of the first switch 302 and the operating state of a second vehicle component (e.g., is a hood latch coupled or released) is determined based on the existing switch state of the second switch 310. At operation 518, a signal is output indicating the operating states of the first and second vehicle components, and the method ends at operation 512.

As described herein, various non-limiting embodiments provide a simultaneous switch detection system 202 which is configured to independently monitor the state of a plurality of switches 302 and 310. The simultaneous switch detection system 202 includes an electronic switch detection controller 204 connected to an input switching circuit 206 which includes a plurality of analog switch assemblies 208 and 210. The switch assemblies 208 and 210 are electrically connected so as to generate a state table indicating various electrical states of the input switching circuit 206. The electrical states of the input switching circuit 206 are cross-referenced to different operating states of a particular vehicle system, sub-system and/or component.

In at least one embodiment, a switch detection controller 204 is configured to determine an existing voltage potential across the input switching circuit 206. Based on the existing voltage potential, the switch detection controller 204 determines the first plurality of switch states independently from the second plurality of switch states, and the second plurality of switch states independently from the first plurality of switch states. Accordingly, the switch state of each analog switch 302 and 310 included in the input switching circuit 206 may be independently and simultaneously analyzed in response to a single input, thereby eliminating the need to prioritize the switches.

As used herein, the term "module" or "unit" refers to an application specific integrated circuit (ASIC), a field programmable gate array (FPGA), an electronic circuit, an electronic computer processor (shared, dedicated, or group) and memory that executes one or more software or firmware programs, a hardware microcontroller, a combinational logic circuit, and/or other suitable components that provide the described functionality. When implemented in software, a module can be embodied in memory as a non-transitory machine-readable storage medium readable by a processing circuit and storing instructions for execution by the processing circuit for performing a method.

While the disclosure has been described with reference to various non-limiting embodiments, it will be understood by those skilled in the art that various changes may be made and equivalents may be substituted for elements thereof. In addition, many modifications may be made to adapt a particular situation or material to the teachings of the disclosure without departing from the essential scope thereof. Therefore, it is intended that the disclosure not be limited to the particular embodiments disclosed, but that it will include all the non-limiting embodiments described herein.

What is claimed is:

1. An automotive vehicle including a switch detection system, comprising:
   a hardware controller including a power supply that generates a supply voltage;
   a first switch assembly including an input terminal that receives the supply voltage, the first switch assembly including a first switch that operates in a first plurality of switch states;
   a second switch assembly connected in series with the first switch assembly and including an output terminal connected to a voltage reference point, the second switch assembly including a second switch that operates in a second plurality of switch states,
   wherein based on a voltage potential across the input terminal and the output terminal, the hardware controller determines the first plurality of switch states independently from the second plurality of switch states, and determines the second plurality of switch states independently from the first plurality of switch states, and
   wherein based on a combination of a current switch state of the first switch assembly and a current switch state of the second switch assembly, the hardware controller determines a current operating state of the automotive vehicle from among a plurality of different operating states,
   wherein the at least one first switch resistor comprises:
      a first resistor including a first terminal connected to the input terminal and an opposing terminal connected to a first pole of the first switch; and
      a second resistor including a first terminal connected to the opposing terminal of the first resistor, and a second terminal connected to a second pole of the first switch such that the second resistor is connected in parallel with the first switch,
      wherein the at least one second switch resistor comprises:
      a third resistor including a first terminal connected to both the second terminal of the second resistor and the second pole of the first switch, and a second terminal connected directly to a first pole of the second switch; and
      a fourth resistor including a first terminal connected directly to both the second terminal of the third resistor and the first pole of the second switch, the third resistor further including an opposing terminal connected directly to a second pole of the second switch such that the fourth resistor is connected in parallel with the second switch.

2. The vehicle of claim 1, wherein the second switch assembly is located remotely from the first switch assembly.

3. The vehicle of claim 1, wherein the plurality of first switch states includes a first switch state and second switch state, and wherein the plurality of second switch states includes first switch state and a second switch state.

4. The vehicle of claim 3, wherein the first and second switch states of the first switch correspond to first and second operating states of a first component installed on the vehicle, and wherein the first and second switch states of the second switch correspond to first and second operating states of a second component installed on the vehicle different from the first component.

5. The vehicle of claim 1, further comprising:
   an initialization circuit connected to the hardware controller and the first switch assembly, and configured to initiate the hardware controller to determine both the first current switch state and the second current switch state in response to operation of one or both of the first switch assembly and the second switch assembly,
   wherein the first switch assembly includes at least one first switch resistor that varies the resistance of the first switch assembly based on the switch state of the first switch, and wherein the second switch assembly includes at least one second switch resistor that varies the resistance of the second switch assembly based on the switch state of the second switch.

6. The vehicle of claim 1, wherein a resistor value of each of the first and second resistors is less than a resistor value of the third resistor.

7. The vehicle of claim 1, wherein a resistor value of each of the first and second resistors is greater than a resistor value of the third resistor.

8. A switch detection system installed on an automotive vehicle, the switch detection system comprising:
   a first switch assembly including a first node that receives a supply voltage, and including a first switch that operates in a first plurality of switch states;
   a second switch assembly connected to a voltage reference point via a second node and connected in series with the first switch assembly via a third node, the second switch assembly including a second switch that operates in a second plurality of switch states; and
   a hardware controller that determines an existing voltage potential across the first and second nodes among a plurality of different voltage potentials, and based on the existing voltage potential, determines the first plurality of switch states independently from the second plurality of switch states, and the second plurality of switch states independently from the first plurality of switch states, and
   wherein based on a combination of a determined switch state of the first switch assembly from among the first plurality of switch states and a determined switch state of the second switch assembly from among the second plurality of switch states, the hardware controller determines a current operating state of the automotive vehicle from among a plurality of different operating states,
   wherein the at least one first switch resistor comprises:
      a first resistor including a first terminal connected to the input terminal and an opposing terminal connected to a first pole of the first switch; and
      a second resistor including a first terminal connected to the opposing terminal of the first resistor, and a second terminal connected to a second pole of the first switch such that the second resistor is connected in parallel with the first switch,
wherein the at least one second switch resistor comprises:
a third resistor including a first terminal connected to both the second terminal of the second resistor and the second pole of the first switch, and a second terminal connected directly to a first pole of the second switch; and
a fourth resistor including a first terminal connected directly to both the second terminal of the third resistor and the first pole of the second switch, the third resistor further including an opposing terminal connected directly to a second pole of the second switch such that the fourth resistor is connected in parallel with the second switch.

9. The switch detection system of claim 8, further comprising:
an initialization circuit connected to the hardware controller and the first switch assembly, and configured to initiate the hardware controller to determine both the first current switch state and the second current switch state in response to operation of one or both of the first switch assembly and the second switch assembly,
wherein the first switch assembly includes at least one first switch resistor that varies the resistance of the first switch assembly based on the switch state of the first switch, and wherein the second switch assembly includes at least one second switch resistor that varies the resistance of the second switch assembly based on the switch state of the second switch.

10. The switch detection system of claim 8, wherein a resistor value of each of the first and second resistors is less than a resistor value of the third resistor.

11. The switch detection system of claim 8, wherein a resistor value of each of the first and second resistors is greater than a resistor value of the third resistor.

12. The switch detection system of claim 8, wherein the hardware controller includes a memory unit that stores a state table that cross-references a plurality of voltages ranges with the plurality of first switch states of the first switch and the plurality of second switch states of the second switch.

13. The switch detection system of claim 12, wherein the hardware controller compares the existing voltage potential to the plurality of voltage ranges listed in the state table, and based on the voltage range that encompasses the existing voltage potential determines the first plurality of switch states independently from the second plurality of switch states, and the second plurality of switch states independently from the first plurality of switch states.

14. A method of simultaneously detecting switch states of a plurality of switches installed on an automotive vehicle, the method comprising:
generating a voltage potential across an input terminal and an output terminal of an input switching circuit, the input switching circuit comprising:
a first switch assembly that includes a first switch that operates in a first plurality of switch states; and
a second switch assembly connected in series with the first switch assembly, the second switch assembly including a second switch that operates in a second plurality of switch states,
varying the voltage potential in response to adjusting a resistance of the input switching circuit, and based on the varied voltage potential, determining the first plurality of switch states independently from the second plurality of switch states, and determining the second plurality of switch states independently from the first plurality of switch states,
determining a current operating state of the automotive vehicle from among a plurality of different operating states based on a combination of a determined switch state of the first switch assembly from among the first plurality of switch states and a determined switch state of the second switch assembly from among the second plurality of switch states.

15. The method of claim 14, wherein the plurality of first switch states includes a first switch state and second switch state, and wherein the plurality of second switch states includes first switch state and a second switch state.

16. The method of claim 15, wherein the first switch assembly includes at least one first switch resistor, and the second switch assembly includes at least one second switch resistor.

17. The method of claim 14, wherein adjusting the resistance of the input switching circuit comprises:
activating the first switch between the first switch state and the second switch to adjust a resistance of the first switch assembly; and
activating the second switch between the first switch state and the second switch to adjust a resistance of the second switch assembly.

* * * * *